(12) United States Patent
Wang et al.

(10) Patent No.: US 11,711,944 B2
(45) Date of Patent: Jul. 25, 2023

(54) ORGANIC LIGHT-EMITTING DIODE DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN); Yicheng Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 144 days.

(21) Appl. No.: 17/184,734

(22) Filed: Feb. 25, 2021

(65) Prior Publication Data

US 2021/0265441 A1    Aug. 26, 2021

(30) Foreign Application Priority Data

Feb. 25, 2020   (CN) .......................... 202010116296.9

(51) Int. Cl.
*H01L 33/50* (2010.01)
*H10K 59/121* (2023.01)
(Continued)

(52) U.S. Cl.
CPC ....... *H10K 59/1216* (2023.02); *H10K 59/122* (2023.02); *H10K 59/123* (2023.02);
(Continued)

(58) Field of Classification Search
CPC ............... H01L 27/3265; H01L 27/322; H01L 27/3246; H01L 27/3248; H01L 27/3272;
(Continued)

(56) References Cited

U.S. PATENT DOCUMENTS 11,239,297 B2    2/2022   Song et al.
2015/0153599 A1*  6/2015   Yamazaki ......... H01L 29/78696
                                                        257/43
(Continued)

FOREIGN PATENT DOCUMENTS

CN    104965362 A    10/2015
CN    109427820 A     3/2019

OTHER PUBLICATIONS

First Office Action, including Search Report, for Chinese Patent Application No. 202010116296.9, dated Feb. 21, 2022, 12 pages.

*Primary Examiner* — Kevin Quarterman
(74) *Attorney, Agent, or Firm* — Westman, Champlin & Koehler, P.A.

(57) ABSTRACT

The present disclosure relates to the field of display technology, and provides an OLED display substrate, a manufacturing method and a display device. The OLED display substrate includes: a base substrate; an active layer arranged on the base substrate; a gate insulation layer arranged at a side of the active layer away from the base substrate; and a gate electrode layer arranged at a side of the gate insulation layer away from the base substrate. An orthogonal projection of the gate electrode layer onto the base substrate at least partially overlaps an orthogonal projection of the active layer onto the base substrate, and the gate electrode layer and the active layer form a first storage capacitor of the OLED display substrate.

12 Claims, 4 Drawing Sheets

(51) Int. Cl.
   *H10K 59/38*   (2023.01)
   *H10K 59/122*  (2023.01)
   *H10K 59/123*  (2023.01)
   *H10K 59/126*  (2023.01)
   *H10K 71/00*   (2023.01)
   *H10K 59/12*   (2023.01)

(52) U.S. Cl.
   CPC ........... *H10K 59/126* (2023.02); *H10K 59/38* (2023.02); *H10K 71/00* (2023.02); *H10K 59/1201* (2023.02)

(58) Field of Classification Search
   CPC ............... H01L 51/56; H01L 2227/323; H01L 27/3258; H01L 27/3262; H01L 27/3276
   See application file for complete search history.

(56) References Cited

U.S. PATENT DOCUMENTS

| | | | |
|---|---|---|---|
| 2015/0243722 A1 | 8/2015 | Kwon et al. | |
| 2017/0345882 A1* | 11/2017 | Nam | H01L 27/3258 |
| 2018/0011356 A1 | 1/2018 | Kong | |
| 2019/0013339 A1* | 1/2019 | Li | H01L 21/77 |
| 2021/0175296 A1* | 6/2021 | Liu | H01L 51/5278 |
| 2021/0193768 A1 | 6/2021 | Song et al. | |

* cited by examiner

ORGANIC LIGHT-EMITTING DIODE DISPLAY SUBSTRATE, MANUFACTURING METHOD THEREOF, AND DISPLAY DEVICE

CROSS-REFERENCE TO RELATED APPLICATION

The present application claims a priority of the Chinese patent application No. 202010116296.9 filed on Feb. 25, 2020, which is incorporated herein by reference in its entirety.

TECHNICAL FIELD

The present disclosure relates to the field of display technology, in particular to an Organic Light-Emitting Diode (OLED) display substrate, a manufacturing method thereof, and a display device.

BACKGROUND

The improvement in a resolution of a display device is a great trend in the display industry. Along with an increase in a size of a display screen, the resolution may increase, and correspondingly a voltage drop of a power source line in a display panel may increase too. In order to reduce the voltage drop of the power source line, a metal line with a relatively large thickness is used as the power source line in the related art.

In the related art, the power source line is located in a dielectric layer between an active layer and a source/drain metal layer, and along with an increase in the thickness of the power source line, correspondingly a thickness of the dielectric layer needs to increase too.

However, in the related art, usually a storage capacitor in a pixel structure consists of a part of the active layer and a part of the source/drain metal layer. When the thickness of the dielectric layer between the active layer and the source/drain metal layer increases, a capacitance of the storage capacitor in the pixel structure may decrease correspondingly, and thereby it is impossible to meet the requirement of the display panel.

SUMMARY

An object of the present disclosure is to provide an OLED display substrate, a manufacturing method thereof, and a display device, so as to solve the problem in the related art where the capacitance of the storage capacitor in the display device is too small.

In one aspect, the present disclosure provides in some embodiments an OLED display substrate, including: a base substrate; an active layer arranged on the base substrate; a gate insulation layer arranged at a side of the active layer away from the base substrate; and a gate electrode layer arranged at a side of the gate insulation layer away from the base substrate. An orthogonal projection of the gate electrode layer onto the base substrate at least partially overlaps an orthogonal projection of the active layer onto the base substrate, and the gate electrode layer and the active layer form a first storage capacitor of the OLED display substrate.

Optionally, the OLED display substrate further includes: a buffer layer arranged at a side of the active layer adjacent to the base substrate; and a light-shielding metal layer arranged between the active layer and the base substrate and within the buffer layer. An orthogonal projection of the light-shielding metal layer onto the base substrate at least partially overlaps the orthogonal projection of the active layer onto the base substrate, and the light-shielding metal layer and the active layer form a second storage capacitor of the OLED display substrate.

Optionally, the active layer includes: a semiconductor member, an orthogonal projection of the semiconductor member onto the base substrate at least partially overlapping the orthogonal projection of the gate electrode layer onto the base substrate; and a conductor member arranged at both ends of the semiconductor member.

Optionally, the OLED display substrate further includes: an interlayer dielectric layer arranged at a side of the buffer layer away from the base substrate and covering the gate insulation layer and the gate electrode layer, a first via-hole being formed in the buffer layer and the interlayer dielectric layer, an orthogonal projection of the first via-hole overlapping at least a part of the light-shielding metal layer, a second via-hole and a third via-hole being formed in the interlayer dielectric layer, an orthogonal projection of the second via-hole covering at least a part of the conductor member, and an orthogonal projection of the third via-hole covering at least a part of the gate electrode layer; and a source/drain metal layer arranged at a side of the interlayer dielectric layer away from the base substrate, and configured to form a source electrode and a drain electrode of a driving transistor and a conductive connection line, the conductive connection line being connected to the light-shielding metal layer through the first via-hole and connected to the gate electrode layer through the third via-hole, and the source electrode and the drain electrode being connected to the conductive member at both ends of the semiconductor member through the second via-hole.

Optionally, the OLED display substrate further includes: a passivation layer arranged at a side of the interlayer dielectric layer away from the base substrate and covering the source/drain metal layer; a color film layer arranged at a side of the passivation layer away from the base substrate; a planarization layer arranged at a side of the color film layer away from the base substrate and covering the color film layer, a fourth via-hole being formed in the planarization layer and the passivation layer, and an orthogonal projection of the fourth via-hole covering at least a part of the drain electrode; a first electrode arranged at a side of the planarization layer away from the base substrate and electrically connected to the drain electrode through the fourth via-hole; a pixel definition layer arranged at a side of the first electrode away from the base substrate and including a pixel aperture area, and an orthogonal projection of the pixel aperture area being located within the color film layer; a light-emitting layer arranged within the pixel aperture area; and a second electrode arranged at a side of the light-emitting layer away from the base substrate.

Optionally, the gate electrode layer includes a transparent conductive pattern and a metal pattern laminated one on another, the transparent conductive pattern includes a first portion not overlapping the metal pattern, and an orthogonal projection of the pixel aperture area of the OLED display substrate onto the base substrate falls within an orthogonal projection of the first portion onto the base substrate.

Optionally, the orthogonal projection of the light-shielding metal layer onto the base substrate at least partially overlaps orthogonal projections of the conductor member and the semiconductor member onto the base substrate.

Optionally, the gate electrode layer includes a transparent conductive pattern and a metal pattern laminated one on another, and an orthogonal projection of the conductor member onto the base substrate at least partially overlaps an orthogonal projection of the transparent conductive pattern onto the base substrate.

Optionally, the orthogonal projection of the light-shielding metal layer onto the base substrate at least partially overlaps the orthogonal projection of the gate electrode layer onto the base substrate.

In another aspect, the present disclosure provides in some embodiments an OLED display device including the above-mentioned OLED display substrate and a packaging layer for packaging the OLED display substrate.

In yet another aspect, the present disclosure provides in some embodiments a method for manufacturing an OLED display substrate, including: providing a base substrate; forming an active layer on the base substrate; forming a gate insulation layer at a side of the active layer away from the base substrate; and forming a gate electrode layer at a side of the gate insulation layer away from the base substrate. The gate electrode layer and the active layer form a first storage capacitor of the OLED display substrate.

Optionally, prior to forming the active layer, the method further includes: forming a light-shielding metal layer on the base substrate; and forming a buffer layer on the base substrate. The buffer layer covers the light-shielding layer, the active layer is arranged at a side of the buffer layer away from the base substrate, and the light-shielding layer and the active layer form a second storage capacitor of the OLED display substrate.

Optionally, the forming the gate electrode layer includes forming a transparent conductive pattern and a metal pattern laminated one on another. The transparent conductive pattern includes a first portion not overlapping the metal pattern, and an orthogonal projection of a pixel aperture area of the OLED display substrate onto the base substrate falls within an orthogonal projection of the first portion onto the base substrate.

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, usually a storage capacitor in a pixel structure consists of a part of an active layer and a part of a source/drain metal layer. Usually, a dielectric layer between the active layer and the source/drain metal layer has a relatively large thickness of up to 6000 Å, so the storage capacitor in the pixel structure may have a relative small capacitance, and thereby it is impossible to meet the requirement of a display device.

An object of the present disclosure is to provide an OLED display substrate, a manufacturing method thereof, and a display device, so as to solve the problem in the related art where the capacitance of the storage capacitor in the display device is too small.

Figure 1:
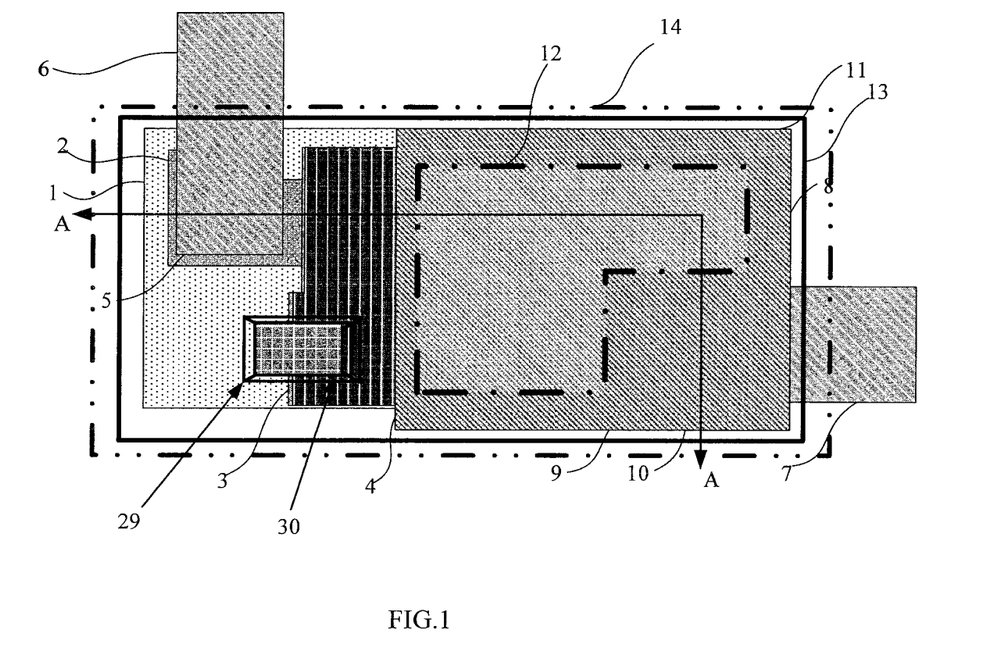
FIG. 1 is a schematic view showing a pixel structure of an OLED display substrate according to one embodiment of the present disclosure.
Figure 7:
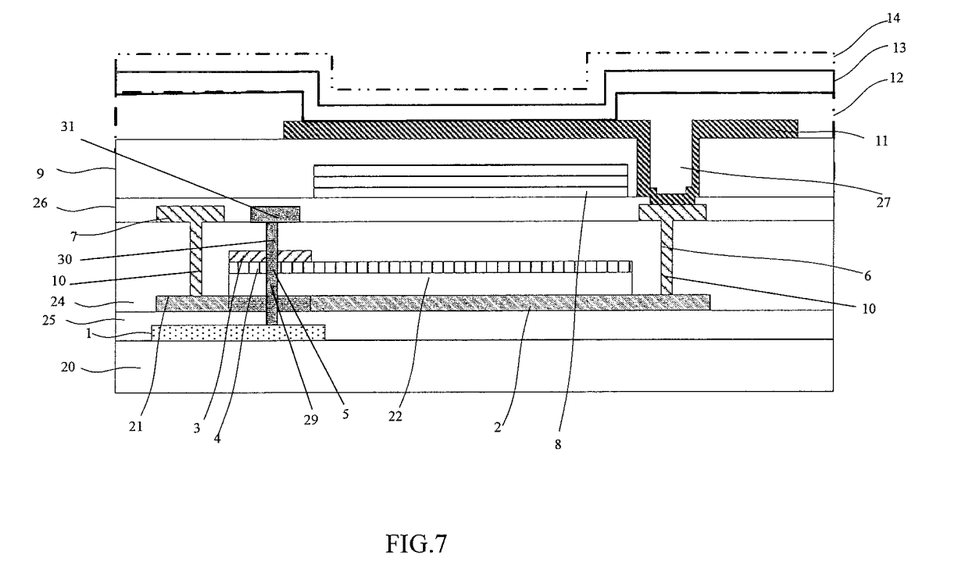

The present disclosure provides in some embodiments an OLED display substrate which, as shown in FIGS. 1 and 7, includes: a base substrate 20; an active layer 2 arranged on the base substrate 20; a gate insulation layer 22 arranged at a side of the active layer 2 away from the base substrate 20; and a gate electrode layer arranged at a side of the gate insulation layer 22 away from the base substrate. An orthogonal projection of the gate electrode layer onto the base substrate at least partially overlaps an orthogonal projection of the active layer 2 onto the base substrate, and the gate electrode layer and the active layer 2 form a first storage capacitor of the OLED display substrate.

In some embodiments of the present disclosure, the gate electrode layer 28 and the active layer of the OLED display substrate may form the first storage capacitor of the OLED display substrate. The first storage capacitor may include the gate electrode layer, the active layer, and the gate insulation layer between the gate electrode layer and the active layer, without being adversely affected by a thickness of an inter-layer dielectric layer between the active layer and a source/drain metal layer. Usually, the gate insulation layer has a relatively small thickness, e.g., about 1500 Å, so it is able to provide a relatively large capacitance.

In some embodiments of the present disclosure, as shown in FIG. 7, the OLED display substrate further includes: a buffer layer 25 arranged at a side of the active layer 2 facing the base substrate 20; and a light-shielding metal layer 1 arranged at a side of the buffer layer facing the base substrate 20. An orthogonal projection of the light-shielding metal layer 1 onto the base substrate at least partially overlaps the orthogonal projection of the active layer 2 onto the base substrate, and the light-shielding metal layer 1 and the active layer 2 form a second storage capacitor of the OLED display substrate. In this regard, it is able to further increase a storage capacitance of the OLED display substrate without any additional patterning process, thereby to reduce the manufacture cost of the OLED display substrate.

In the embodiments of the present disclosure, as shown in FIG. 7, the active layer 2 includes: a semiconductor member, an orthogonal projection of the semiconductor member onto the base substrate at least partially overlapping the orthogonal projection of the gate electrode layer onto the base substrate; and a conductor member 21 arranged at both ends of the semiconductor member. The conductor member 21 may be acquired through subjecting a semiconductor material to conductor-formation treatment.

Figure 8:
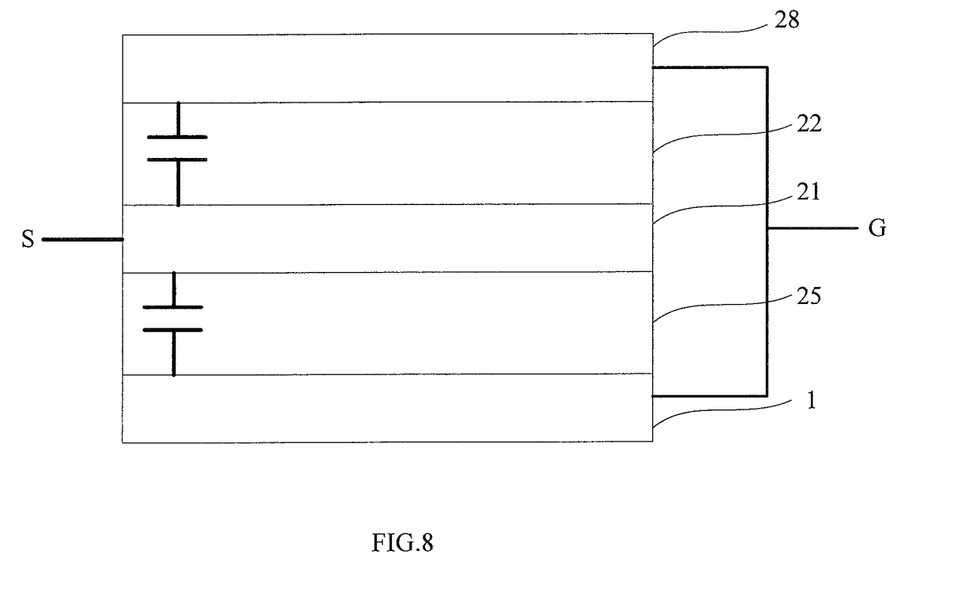
FIG. 8 is a schematic view showing a storage capacitor of the OLED display substrate according to one embodiment of the present disclosure.

In the active layer 2, the conductor member 21 may serve as an electrode plate of the first storage capacitor and the second storage capacitor. The light-shielding metal layer 1, as an electrode plate of the second storage capacitor, may be electrically connected to the gate electrode layer, as an electrode plate of the first storage capacitor. FIG. 8 shows an equivalent structure of the storage capacitor. As shown in FIG. 8, the first storage capacitor consists of the gate electrode layer 28 and the conductor member 21, and the second storage capacitor consists of the light-shielding metal layer 1 and the conductor member 21. In the embodiments of the present disclosure, a storage capacitor of the OLED display substrate may consist of the first storage capacitor and the second storage capacitor laminated one on another, so as to increase the capacitance of the storage capacitor in the case of a same occupation area, thereby to reduce an area of the storage capacitor in the OLED display substrate while satisfying the requirement on the capacitance of the storage capacitor, and improve an aperture ratio of the display device. A source electrode 7 of a driving transistor may be electrically connected to the conductor member 21, and the gate electrode layer may be just a gate electrode of the driving transistor.

In some embodiments of the present disclosure, the buffer layer 25 and the gate insulation layer 22 may serve as dielectric layers of the second storage capacitor and the first storage capacitor respectively. The buffer layer 25 and the gate insulation layer 22 each has a relatively small thickness, so it is able to provide a relatively storage capacitance. The buffer layer 25 and the gate insulation layer 22 may each be made of an insulation material, e.g., silicon oxide, silicon nitride, or silicon oxynitride. The light-shielding metal layer 1 may be made of a commonly-used metal material, e.g., molybdenum (Mo), aluminum (Al), titanium (Ti), gold (Au), copper (Cu), hafnium (Hf) or tantalum (Ta).

In some embodiments of the present disclosure, as shown in FIGS. 1 and 7, the OLED display substrate further includes: an interlayer dielectric layer 24 arranged at a side of the buffer layer 25 away from the base substrate 20 and covering the gate insulation layer 22 and the gate electrode layer, a first via-hole 29 being formed in the buffer layer 25 and the interlayer dielectric layer 24, an orthogonal projection of the first via-hole 29 overlapping at least a part of the light-shielding metal layer 1, second via-holes 10 and a third via-hole 30 being formed in the interlayer dielectric layer 24, an orthogonal projection of the second via-holes 10 covering at least a part of the conductor member 21, and an orthogonal projection of the third via-hole 30 covering at least a part of the gate electrode layer; and a source/drain metal layer arranged at a side of the interlayer dielectric layer 24 away from the base substrate 20, and configured to form the source electrode 7 and a drain electrode 6 of the driving transistor and a conductive connection line 31. The conductive connection line 31 may be connected to the light-shielding metal layer 1 through the first via-hole 29 and connected to the gate electrode layer through the third via-hole 30 so as to enable the gate electrode layer to be electrically connected to the light-shielding metal layer 1. The first via-hole 29 and the third via-hole 30 may communicate with each other to form a via-hole 5. The source electrode 7 and the drain electrode 6 may be connected to the conductive member 21 at both ends of the semiconductor member through the second via-holes 10 respectively.

In some embodiments of the present disclosure, as shown in FIG. 7, the OLED display substrate further includes: a passivation layer 26 arranged at a side of the interlayer dielectric layer 24 away from the base substrate and covering the source/drain metal layer; a color film layer 8 arranged at a side of the passivation layer 26 away from the base substrate 20; a planarization layer 9 arranged at a side of the color film layer 8 away from the base substrate 20 and covering the color film layer 8, a fourth via-hole 27 being formed in the planarization layer 9 and the passivation layer 26, and an orthogonal projection of the fourth via-hole 27 covering at least a part of the drain electrode 6; a first electrode 11 arranged at a side of the planarization layer 9 away from the base substrate 20 and electrically connected to the drain electrode 6 through the fourth via-hole 27; a pixel definition layer 12 arranged at a side of the first electrode 11 away from the base substrate 20 and including a pixel aperture area, and an orthogonal projection of the pixel aperture area being located within the color film layer 8; a light-emitting layer 13 arranged within the pixel aperture area; and a second electrode 14 arranged at a side of the light-emitting layer 13 away from the base substrate 20.

In some embodiments of the present disclosure, the OLED display substrate may be of a top-emission structure or a bottom-emission structure. When the OLED display substrate is of the top-emission structure, the first electrode may be a metal reflective layer made of Al or an alloy thereof, and correspondingly, the second electrode may be a transparent conductive layer made of Indium Tin Oxide (ITO). When the OLED display substrate is of a bottom-emission structure, the second electrode may be a metal reflective layer made of Al or an alloy thereof, and correspondingly, the first electrode may be a transparent conductive layer made of ITO.

In some embodiments of the present disclosure, as shown in FIG. 7, the gate electrode layer 28 includes a transparent conductive pattern 4 and a metal pattern 3 laminated one on another, the transparent conductive pattern 4 includes a first portion not overlapping the metal pattern 3, and an orthogonal projection of the pixel aperture area of the OLED display substrate onto the base substrate falls within an orthogonal projection of the first portion onto the base substrate. In this regard, the electrode plate of the first storage capacitor at the pixel aperture area may be the transparent conductive pattern, so as to prevent a display effect of each pixel from being adversely affected, thereby to effectively increase an aperture ratio of the pixel.

The present disclosure further provides in some embodiments an OLED display device including the above-mentioned OLED display substrate and a packaging layer for packaging the OLED display substrate.

The display device may include, but not limited to, a radio frequency unit, a network module, an audio output unit, an input unit, a sensor, a display unit, a user input unit, an interface unit, a memory, a processor and a power source. It should be appreciated that, the aforementioned structure shall not be construed as limiting the display device. The display device may include more or fewer members, or some members may be combined, or the members may be arranged in different modes. In the embodiments of the present disclosure, the display device may include, but not limited to, display, mobile phone, tablet computer, television, wearable electronic device or navigator.

The display device may be any product or member having a display function, e.g., television, display, digital photo frame, mobile phone or tablet computer. The display device may further include a flexible circuit board, a printed circuit board and a back plate.

The present further provides in some embodiments a method for manufacturing an OLED, which includes: providing a base substrate; forming an active layer on the base substrate; forming a gate insulation layer at a side of the active layer away from the base substrate; and forming a gate electrode layer at a side of the gate insulation layer away from the base substrate. The gate electrode layer and the active layer form a first storage capacitor of the OLED display substrate.

In some embodiments of the present disclosure, the gate electrode layer and the active layer of the OLED display substrate may form the first storage capacitor of the OLED display substrate. The first storage capacitor may include the gate electrode layer, the active layer, and the gate insulation layer between the gate electrode layer and the active layer, without being adversely affected by a thickness of an interlayer dielectric layer between the active layer and a source/drain metal layer. Usually, the gate insulation layer has a relatively small thickness, e.g., about 1500 Å, so it is able to provide a relatively large capacitance.

In some embodiments of the present disclosure, prior to forming the active layer, the method may further include: forming a light-shielding metal layer on the base substrate; and forming a buffer layer on the base substrate. The buffer layer may cover the light-shielding layer, the active layer may be arranged at a side of the buffer layer away from the base substrate, and the light-shielding layer and the active layer may form a second storage capacitor of the OLED display substrate. In this regard, it is able to further increase a storage capacitance of the OLED display substrate without any additional patterning process, thereby to reduce the manufacture cost of the OLED display substrate.

Optionally, the forming the gate electrode layer may include forming a transparent conductive pattern and a metal pattern laminated one on another. The transparent conductive pattern may include a first portion not overlapping the metal pattern, and an orthogonal projection of a pixel aperture area of the OLED display substrate onto the base substrate may fall within an orthogonal projection of the first portion onto the base substrate. In this regard, an electrode plate of the first storage capacitor at the pixel aperture area may be the transparent conductive pattern, so as to prevent a display effect of each pixel from being adversely affected, thereby to effectively increase an aperture ratio of the pixel.

As shown in FIGS. 2 to 7, the method for manufacturing the OLED display substrate in the embodiments of the present disclosure may specifically include the following steps.

Figure 2:
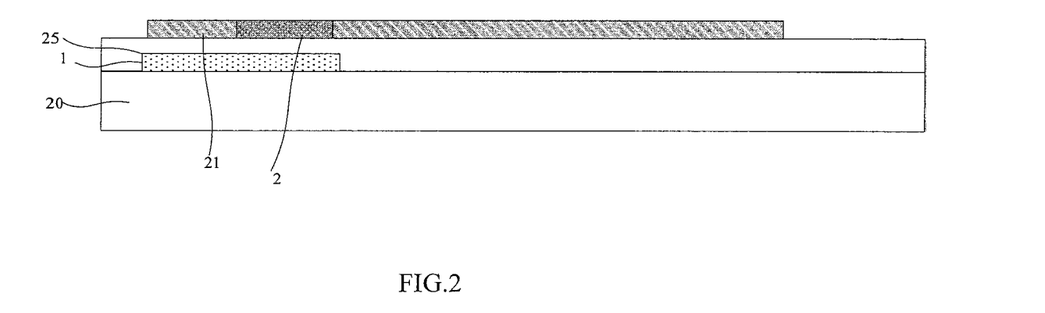
FIGS. 2-7 are schematic views showing a method for manufacturing the OLED display substrate according to one embodiment of the present disclosure.

Step 1: as shown in FIG. 2, the light-shielding metal layer 1, the buffer layer 25 and the active layer 2 may be formed on the base substrate 20.

To be specific, a light-shielding metal material may be deposited onto the base substrate 20, and then patterned to form a pattern of the light-shielding metal layer 1. The light-shielding metal layer 1 may be made of a commonly-used metal material, e.g., Mo, Al, Ti, Au, Cu, Hf or Ta, or an alloy such as AlNd or MoNb.

Next, the buffer layer 25 may be deposited. The buffer layer 25 may be made of an insulation material such as silicon oxide, silicon nitride or silicon oxynitride. Next, a semiconductor material may be formed on the buffer layer 25 and then patterned to form a pattern of the active layer 2. Then, a part of the active layer 2 may be subjected to conductor-formation treatment to form the conductor member 21. The semiconductor material may be an oxide, silicon, or an organic material, e.g., a-IGZO, ZnON, IZTO, a-Si, p-Si, sexithiophene or polythiophene.

In some embodiments of the present disclosure, prior to the formation of the gate insulation layer and the gate electrode layer, the semiconductor material needs to be subjected to the conductor-formation treatment to form the conductor member.

Figure 3:
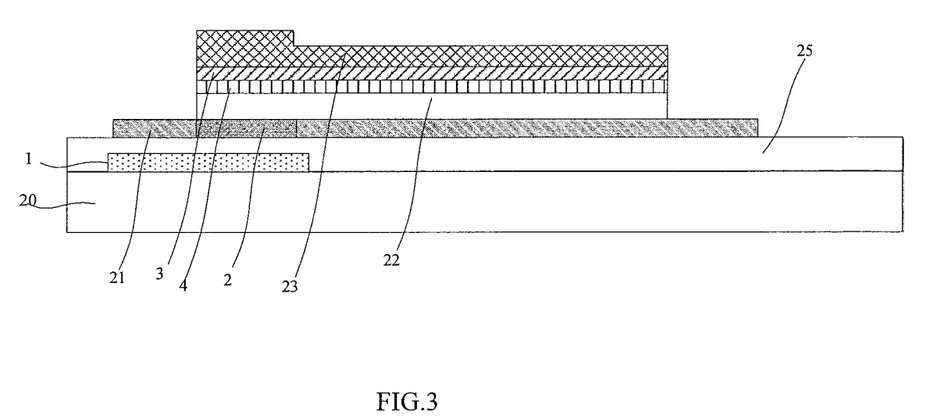

Step 2: as shown in FIG. 3, the gate insulation layer 22, the transparent conductive pattern 4 and the metal pattern 3 may be formed.

The gate insulation layer 22 may be made of an insulation material such as silicon oxide, silicon nitride or silicon oxynitride. The metal pattern 3 may be made of a commonly-used metal material, e.g., Mo, Al, Ti, Au, Cu, Hf or Ta, or MoNd/Cu/MoNd. The transparent conductive pattern 4 may be made of ITO or IZO.

Next, a photoresist 5 may be applied onto the metal pattern 3, and then exposed and developed to form two regions with different thicknesses. A thickness of the photoresist 5 corresponding to the metal pattern 3 may be greater than a thickness of the photoresist 5 at a first region, and the first region may correspond to the portion of the transparent conductive pattern 4 not overlapping the metal pattern 3.

Figure 4:
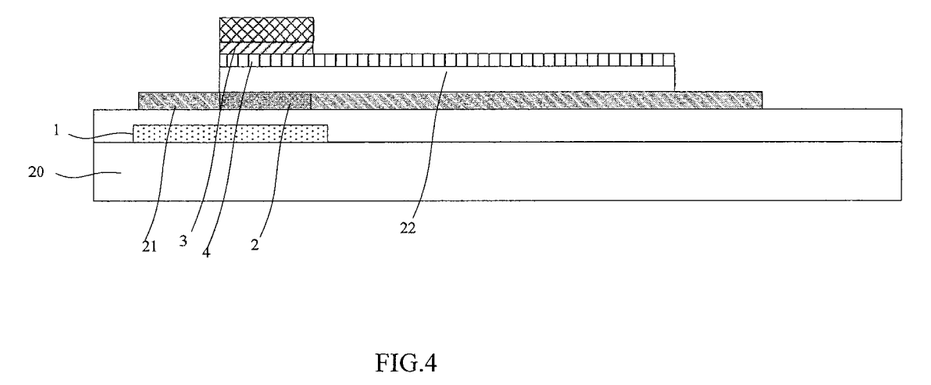

Step 3: as shown in FIG. 4, the photoresist 5 at the first region may be ashed, and the metal pattern 3 at the first region may be etched off.

In this regard, at a pixel capacitor area, the gate electrode layer may include the metal pattern 3 and the transparent conductive pattern 4, and at a transparent capacitor area, the gate electrode layer may merely include the transparent conductive pattern 4.

Figure 5:
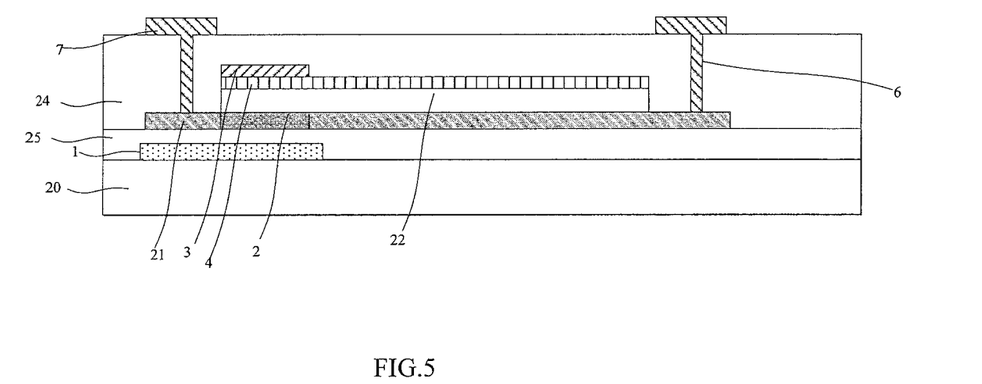

Step 4: as shown in FIG. 5, the interlayer dielectric layer 24 and a pattern of the source/drain metal layer may be formed.

The interlayer dielectric layer 24 may be made of an insulation material such as silicon oxide, silicon nitride or silicon oxynitride. The pattern of the source/drain metal layer may be made of a commonly-used metal material, e.g., Mo, Al, Ti, Au, Cu, Hf or Ta, or MoNd/Cu/MoNd, and it may include the source electrode 7, the drain electrode 6, and the conductive connection line connecting the light-shielding metal layer 1 and the gate electrode layer.

Figure 6:
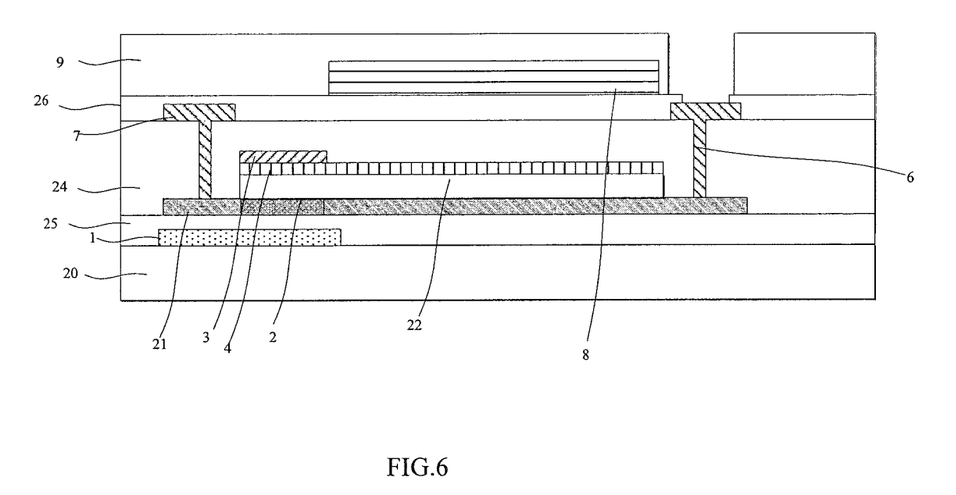

Step 5: as shown in FIG. 6, the passivation layer 26, the color film layer 8 and the planarization layer 9 may be formed.

The passivation layer 26 may be made of an insulation material, e.g., silicon oxide, silicon nitride, or silicon oxynitride.

The color film layer 8 may include a red color filter unit, a green color filter unit, and a blue color filter unit.

The planarization layer 9 may be made of resin, SOG or BCB.

Step 6: as shown in FIG. 7, the first electrode 11, the pixel definition layer 12, the light-emitting layer 13 and the second electrode 14 may be formed.

FIG. 7 is a sectional view of the OLED display substrate along AA. The first electrode 11 is connected to the drain electrode 6 through a via-hole penetrating through the planarization layer 9, and it may be a transparent anode made of a transparent conductive oxide, e.g., AZO or IZO, or a thin composite material, e.g., Mg/Ag, Ca/Ag, Sm/Ag, Al/Ag, or Ba/Ag.

The light-emitting layer 13 may be formed through printing or evaporation.

The second electrode 14 may be a reflective cathode made of Al or an alloy thereof.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including"

intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An Organic Light-Emitting Diode (OLED) display substrate, comprising:
   a base substrate;
   an active layer arranged on the base substrate;
   a gate insulation layer arranged at a side of the active layer away from the base substrate; and
   a gate electrode layer arranged at a side of the gate insulation layer away from the base substrate,
   wherein an orthogonal projection of the gate electrode layer onto the base substrate at least partially overlaps an orthogonal projection of the active layer onto the base substrate, and the gate electrode layer and the active layer form a first storage capacitor of the OLED display substrate,
   wherein the gate electrode layer comprises a transparent conductive pattern and a metal pattern laminated one on another, the transparent conductive pattern comprises a first portion not overlapping the metal pattern, an orthogonal projection of the pixel aperture area of the OLED display substrate onto the base substrate falls within an orthogonal projection of the first portion onto the base substrate.

2. The OLED display substrate according to claim 1, further comprising:
   a buffer layer arranged at a side of the active layer adjacent to the base substrate; and
   a light-shielding metal layer arranged between the active layer and the base substrate and within the buffer layer,
   wherein an orthogonal projection of the light-shielding metal layer onto the base substrate at least partially overlaps the orthogonal projection of the active layer onto the base substrate, and the light-shielding metal layer and the active layer form a second storage capacitor of the OLED display substrate.

3. The OLED display substrate according to claim 2, wherein the active layer comprises:
   a semiconductor member, an orthogonal projection of the semiconductor member onto the base substrate at least partially overlapping the orthogonal projection of the gate electrode layer onto the base substrate; and
   a conductor member arranged at both ends of the semiconductor member.

4. The OLED display substrate according to claim 3, further comprising:
   an interlayer dielectric layer arranged at a side of the buffer layer away from the base substrate and covering the gate insulation layer and the gate electrode layer, a first via-hole being formed in the buffer layer and the interlayer dielectric layer, an orthogonal projection of the first via-hole overlapping at least a part of the light-shielding metal layer, a second via-hole and a third via-hole being formed in the interlayer dielectric layer, an orthogonal projection of the second via-hole covering at least a part of the conductor member, and an orthogonal projection of the third via-hole covering at least a part of the gate electrode layer; and
   a source/drain metal layer arranged at a side of the interlayer dielectric layer away from the base substrate, and configured to form a source electrode and a drain electrode of a driving transistor and a conductive connection line, the conductive connection line being connected to the light-shielding metal layer through the first via-hole and connected to the gate electrode layer through the third via-hole, and the source electrode and the drain electrode being connected to the conductive member at both ends of the semiconductor member through the second via-hole.

5. The OLED display substrate according to claim 4, further comprising:
   a passivation layer arranged at a side of the interlayer dielectric layer away from the base substrate and covering the source/drain metal layer;
   a color film layer arranged at a side of the passivation layer away from the base substrate;
   a planarization layer arranged at a side of the color film layer away from the base substrate and covering the color film layer, a fourth via-hole being formed in the planarization layer and the passivation layer, and an orthogonal projection of the fourth via-hole covering at least a part of the drain electrode;
   a first electrode arranged at a side of the planarization layer away from the base substrate and electrically connected to the drain electrode through the fourth via-hole;
   a pixel definition layer arranged at a side of the first electrode away from the base substrate and comprising a pixel aperture area, an orthogonal projection of the pixel aperture area being located within the color film layer;
   a light-emitting layer arranged within the pixel aperture area; and
   a second electrode arranged at a side of the light-emitting layer away from the base substrate.

6. The OLED display substrate according to claim 3, wherein the orthogonal projection of the light-shielding metal layer onto the base substrate at least partially overlaps orthogonal projections of the conductor member and the semiconductor member onto the base substrate.

7. The OLED display substrate according to claim 3, wherein the gate electrode layer comprises a transparent conductive pattern and a metal pattern laminated one on another, and an orthogonal projection of the conductor member onto the base substrate at least partially overlaps an orthogonal projection of the transparent conductive pattern onto the base substrate.

8. The OLED display substrate according to claim 2, wherein the orthogonal projection of the light-shielding metal layer onto the base substrate at least partially overlaps the orthogonal projection of the gate electrode layer onto the base substrate.

9. An OLED display device comprising the OLED display substrate according to claim 1 and a packaging layer for packaging the OLED display substrate.

10. A method for manufacturing an OLED display substrate, comprising:
   providing a base substrate; forming an active layer on the base substrate;
   forming a gate insulation layer at a side of the active layer away from the base substrate; and
   forming a gate electrode layer at a side of the gate insulation layer away from the base substrate,
   wherein the gate electrode layer and the active layer form a first storage capacitor of the OLED display substrate,
   wherein the forming the gate electrode layer comprises forming a transparent conductive pattern and a metal pattern laminated one on another, wherein the transparent conductive pattern comprises a first portion not overlapping the metal pattern, and an orthogonal projection of a pixel aperture area of the OLED display substrate onto the base substrate falls within an orthogonal projection of the first portion onto the base substrate.

11. The method according to claim 10, wherein prior to forming the active layer, the method further comprises:
   forming a light-shielding metal layer on the base substrate; and
   forming a buffer layer on the base substrate,
   wherein the buffer layer covers the light-shielding layer, the active layer is arranged at a side of the buffer layer away from the base substrate, and the light-shielding layer and the active layer form a second storage capacitor of the OLED display substrate.

12. The method according to claim 11, wherein the forming the gate electrode layer comprises forming a transparent conductive pattern and a metal pattern laminated one on another, wherein the transparent conductive pattern comprises a first portion not overlapping the metal pattern, and an orthogonal projection of a pixel aperture area of the OLED display substrate onto the base substrate falls within an orthogonal projection of the first portion onto the base substrate.

* * * * *